United States Patent [19]

Yoshida et al.

[11] Patent Number: 5,049,956
[45] Date of Patent: Sep. 17, 1991

[54] MEMORY CELL STRUCTURE OF SEMICONDUCTOR MEMORY DEVICE

[75] Inventors: Tohru Yoshida, Warabi; Mitsumasa Furukawa, Ooita, both of Japan

[73] Assignee: Kabushiki Kaisha Toshiba, Kawasaki, Japan

[21] Appl. No.: 549,081

[22] Filed: Jul. 6, 1990

[30] Foreign Application Priority Data

Jul. 13, 1989 [JP] Japan .................................. 1-179145

[51] Int. Cl.$^5$ ..................... H01L 29/68; H01L 29/06; H01L 27/02
[52] U.S. Cl. .................................. 357/23.5; 357/55; 357/41
[58] Field of Search ............................... 357/23.5, 55

[56] References Cited

U.S. PATENT DOCUMENTS 4,222,063 9/1980 Rodgers .............................. 357/23.5
4,929,988 5/1990 Yoshikawa ......................... 357/23.5

FOREIGN PATENT DOCUMENTS 61-256673 11/1986 Japan .................................. 357/23.5
62-76563 4/1987 Japan .................................. 357/23.5

Primary Examiner—Rolf Hille
Assistant Examiner—Robert P. Limanek
Attorney, Agent, or Firm—Finnegan, Henderson, Farabow, Garrett and Dunner

[57] ABSTRACT

In a memory call of an EPROM, a drain region, a channel region, and a source region are formed in a direction perpendicular to the surface of a semiconductor substrate. A trench is provided, which penetrates the drain region and the channel region and reaches the source region. A floating gate and a control gate are formed in the trench, in a direction perpendicular to the surface of the semiconductor substrate.

4 Claims, 3 Drawing Sheets

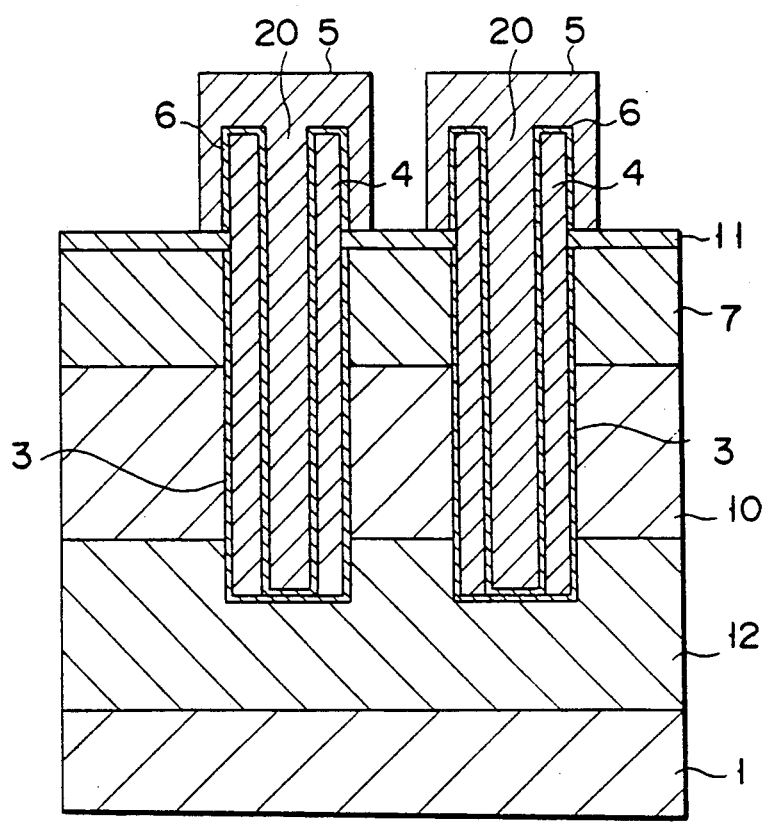
F I G. 3
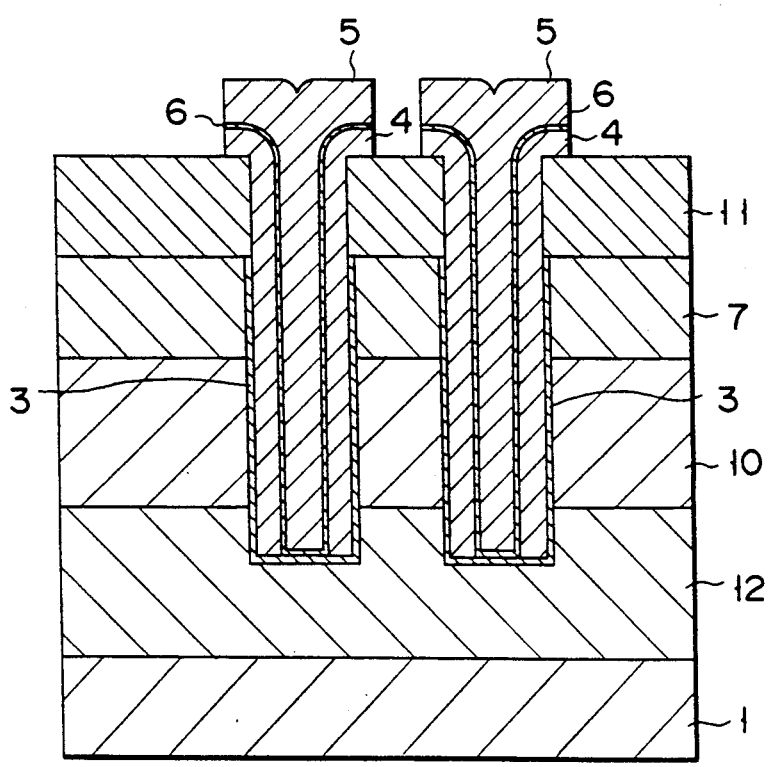
F I G. 4

5,049,956

MEMORY CELL STRUCTURE OF SEMICONDUCTOR MEMORY DEVICE

BACKGROUND OF THE INVENTION

1. Field of the Invention

The present invention relates generally to a semiconductor memory device, and more particularly to the memory cell structure of an EPROM (Erasable Programmable Read-Only Memory) with high integration density.

2. Description of the Related Art

The structure of a memory cell employed in a conventional EPROM is similar to that of a general MOS transistor, except for the gate structure, wherein a so-called floating gate is arranged between a control gate and a silicon substrate. Data is written in the memory cell by injecting electrons into the floating gate, that is, by charging the floating gate. Data "1" corresponds to the non-charged state, and data "0" corresponds to the charged state.

When data "0" is written in the memory cell, a high voltage (e.g. $Vd \geq 10$ V) is applied across the control gate and the drain of the memory cell storing data "1" representative of the non-charged state. In this case, the depletion layer near the drain has a high electric field ($10^6$V/cm or more), and hot electrons due to impact ionization are attracted by the potential of the floating gate and are injected thereinto. As the injection of hot electrons progresses, with a coulomb repulsion force due to charged electrons, the injection is saturated.

FIG. 1 shows the memory cell structure of a general EPROM. Symbol C1 denotes a capacitance between a channel 1a and a floating gate 4, C2 a capacitance between the floating gate 4 and a control gate 5, and C3 a capacitance between the floating gate 4 and a drain region 7.

The floating gate potential Vf determined by the injection of hot electrons is given by:

$$Vf = \frac{C2Vg + C3Vd}{C1 + C2 + C3} + \frac{\Delta Q}{C1 + C2 + C3} \quad (1)$$

where $\Delta Q$ is the charge accumulated in the floating gate by means of the injection of hot electrons.

When data "0" is written in the EPROM, the following modification is required in order to increase the efficiency of injection of hot electrons into the floating gate. Namely, as is obvious from formula (1), the capacitance C2 between the control gate and the floating gate is increased, or the capacitance C3 between the floating gate and the drain is increased. In the prior art, in order to increase the capacitance C2, both the areas of the control gate 5 and the floating gate 4 are enlarged about two or three times the area of activation area 1a. As a result, the value of capacitance C2 can be raised to about 2×C1. With this structure, however, a large area on the chip is occupied by the gates; thus, the integration density of cells on the chip is limited. The capacitance C3 is formed by the overlapped portion between the n+ diffusion region (bit line) and the floating gate 4. In order to enlarge the capacitance C3, it is necessary to increase the gate length and form a large n+ diffusion layer below the gate. That is, it is necessary to increase the depth of the drain region 7, which would involve a difficult manufacturing step.

SUMMARY OF THE INVENTION

The present invention has been made in consideration of the above problem, and its object is to provide an EPROM which is integrated with a high density by means of a trench technique, wherein the capacitance between a control gate and a floating gate and the capacitance between the floating gate and a drain are increased, thereby increasing the efficiency of hot carrier injection in the write mode.

In order to achieve this object, there is provided a memory cell employed in an erasable programmable read-only memory, comprising: a semiconductor substrate; a source region formed on the substrate; a channel region formed on the source region; a drain region formed on the channel region; a trench penetrating the drain region and the channel region, reaching the source region, and extending in a direction substantially perpendicular to the surface of the substrate; a first gate insulating layer formed on the inner surface of the trench; a first conductor formed in contact with the inner surface of the first gate insulating layer; a floating gate having the first gate insulating layer and the first conductor; a second gate insulating layer formed on a part of the surface of the first conductor, which is not in contact with the first gate insulating layer; a second conductor formed on that surface of the second insulating layer, which is opposite to the surface in contact with the first conductor; and a control gate having the second gate insulating layer and the second conductor.

According to the present invention, the area of each memory cell in a semiconductor chip can be largely decreased. Thus, the integration density of the EPROM can be increased, and the efficiency of hot carrier injection in the floating gate can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross sectional view taken along line A—A' in FIG. 2;

FIG. 4 shows a second embodiment of the present invention; and

DETAILED DESCRIPTION OF THE PREFERRED EMBODIMENTS

Figure 1:
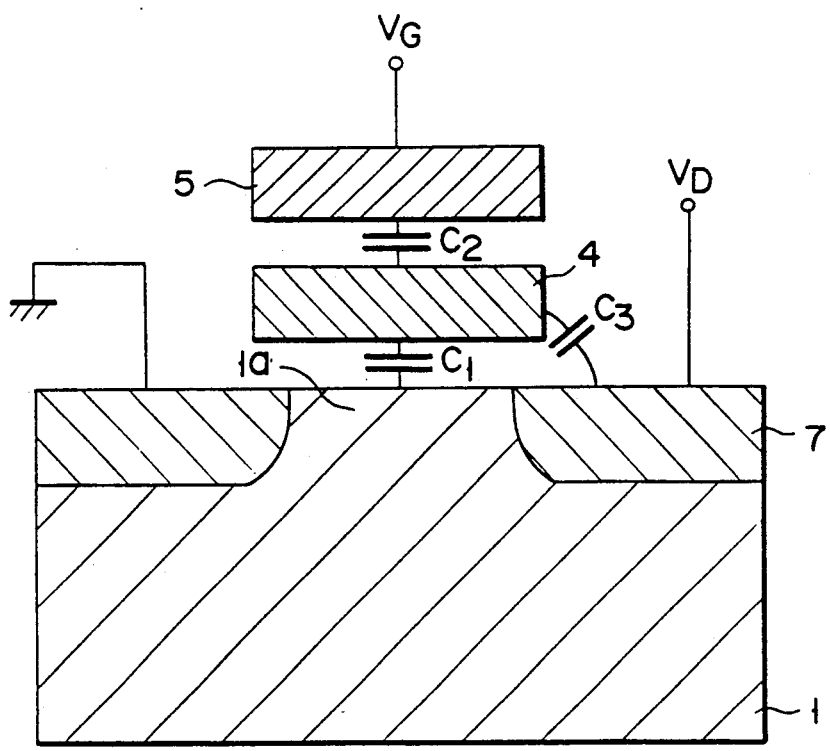
FIG. 1 is a cross-sectional view for schematically showing the structure of a conventional EPROM memory cell.
Figure 2:
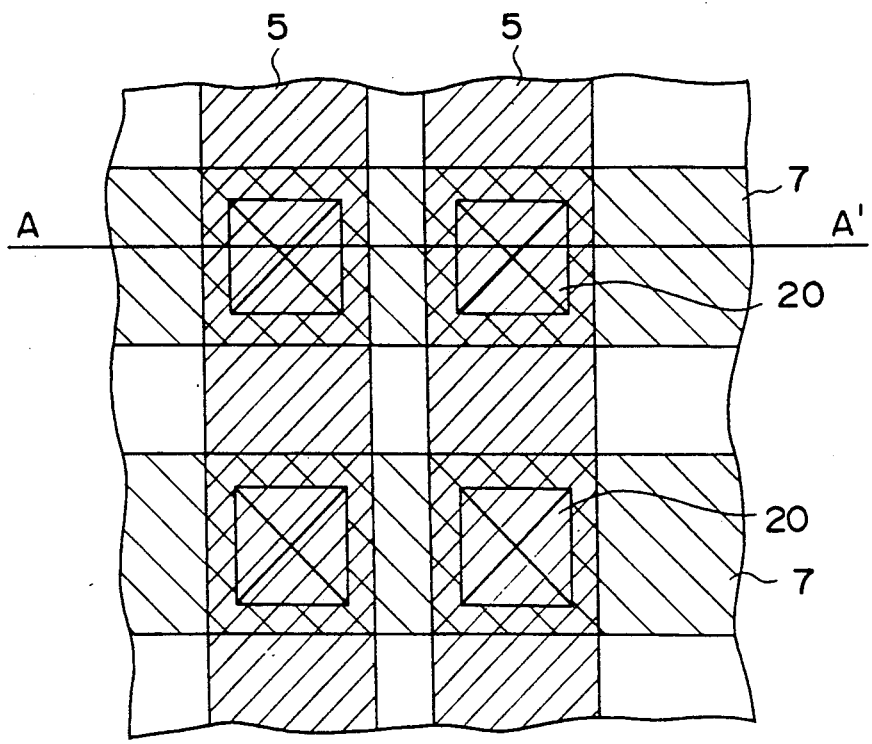
FIG. 2 is a plan view showing an arrangement of an EPROM memory cell according to a first embodiment of the present invention.

A first embodiment of the present invention will now be described with reference to FIGS. 2 and 3. FIG. 2 shows a cell pattern of an EPROM according to the present invention, and FIG. 3 is a cross-sectional view taken along line A—A' in FIG. 2.

Referring to FIG. 3, Sb (antimony), having a low diffusion constant, is doped only in the cell portion of the silicon substrate 1, thereby forming an n+ buried layer ($Nd \approx 1 \times 10^{20} cm^{-3}$) 12. The layer 12 functions as a source region of a cell transistor (i.e. a transistor used in a memory cell). A P-type epitaxial layer ($Na \approx 4 \times 10^{16} cm^{-3}$) 10 having a thickness of about 2.5 $\mu$m is grown on the n+ buried layer 12. The layer 10 serves as a channel region of a vertical transistor. An n+ diffused layer 7, which functions as a bit line and has a width of 1.5 $\mu$m and a depth of 1.0 $\mu$m, is formed on the epitaxial layer 10. An insulating layer 11 having a through-hole at regions of trenches to be formed is deposited by means of thermal oxidation or CVD (Chemical Vapor Deposition). The insulating layer 11 is formed of silicon oxide ($SiO_2$), for example, and is used as a trench mask. Using the trench mask 11, trenches 20 having a size of 1.0 $\mu$m × 1.0 $\mu$m are formed in a bit line. A gate oxide layer 3 having a thickness of about 150 Å is formed on the inner surface of each trench. A first polycrystalline silicon gate 4 having a thickness of about 0.2 to 0.3 $\mu$m is deposited on the gate oxide layer 3 by means of chemical vapor deposition (CVD) or the like. The first polycrystalline silicon gate 4 serves as a floating gate, and projects from the substantial surface of the silicon substrate 1 (i.e. the surface of the insulating layer 11) by about 1 $\mu$m.

A second gate oxide layer 6 of, e.g. silicon dioxide, having a thickness of about 200 to 300 Å, is deposited on the first polycrystalline silicon gate 4. A second polycrystalline silicon layer 5, serving as a control gate, is deposited on the second gate oxide layer 6. As is shown in FIG. 3, the control gate 5 completely covers the projecting floating gate 4.

According to a second embodiment shown in FIG. 4, an insulating layer 11 having a thickness of 1 $\mu$m and serving as a trench mask is formed. The outer surface of the first polycrystalline silicon gate 4, exposed from a drain region 7, is substantially covered by the insulating layer 11. The control gate 5 is formed almost only at the inside of the first polycrystalline silicon gate 4.

Figure 5:
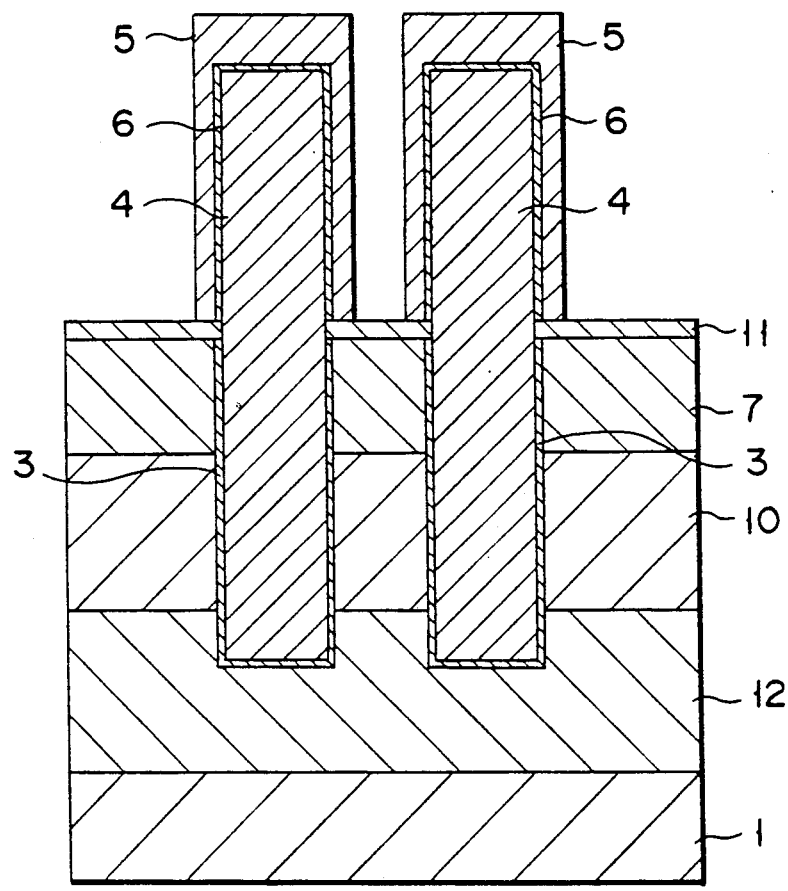
FIG. 5 shows a third embodiment of this invention.

According to a third embodiment shown in FIG. 5, the first polycrystalline silicon gate 4 completely fills in the trench defined by insulating layer 3. The first polycrystalline silicon gate 4 projects from the substantial surface of a silicon substrate 1 (i.e. the surface of an insulating surface 11) by 2 $\mu$m. Control gate 5 is formed over the entire surface of the projecting first polycrystalline silicon gate 4, with an insulating layer 6 being interposed therebetween.

In any one of the above embodiments, since the vertical structure is employed in the cell, the area of the cell can be reduced to half that of a conventional cell. While in the prior art, the capacitance C3 between the floating gate and the drain was close to 0, in the present invention, the capacitance C3 can be increased only by increasing the depth of the n+ diffused layer 7. In addition, by projecting the control gate and the floating gate substantially from the substrate, the capacitance C2 between the control gate and the floating gate can be increased. It is technically easy to set the height of the projecting portion to be greater than ½ the thickness of the channel region or P-type epitaxial layer 10.

The material of the second insulating layer 6, $SiO_2$, may be replaced with $SiO_2/Si_3N_4/SiO_2$, or $SiO_2/Si_3N_4$.

The capacitance C2 between the control gate 5 and the floating gate 4 can be varied by shifting the projecting portion vertically with respect to the substantial surface of the silicon substrate 1. Therefore, after the photomask is formed, the capacitance can be easily controlled.

The present invention is obviously applicable not only to an EPROM, but also to EEPROM (Electrically Erasable Programmable Read-Only Memory).

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A memory cell employed in an erasable programmable read-only memory, comprising:
    a semiconductor substrate having a surface;
    a source region formed on the substrate;
    a channel region formed on the source region;
    a drain region formed on the channel region;
    a trench penetrating the drain region and the channel region, reaching the source region, and extending in a direction substantially perpendicular to the surface of the substrate the trench including an inner surface;
    a floating gate comprising a first gate insulating layer formed on the inner surface of the trench, including an inner surface, and a first conductor formed in partial contact with the inside surface of the first gate insulating layer, and including a portion not in contact with the first gate insulating layer; and
    a control gate comprising a second gate insulating layer formed on the portion of the first conductor which is not in contact with the first gate insulating layer, and a second conductor formed on the second gate insulating layer opposite to the portion in contact with the first conductor;
    wherein a portion of the floating gate and a portion of the control gate project perpendicularly from the surface of the semiconductor substrate.

2. The memory cell according to claim 1, also including an insulating layer on the drain region having a predetermined thickness such that the capacitance between the floating gate and the control gate is at a predetermined value.

3. The memory cell according to claim 1, wherein said control gate projects from the substantial surface of the substrate.

4. The memory cell according to claim 1, wherein said read-only memory is an electrically erasable programmable read-only memory.

* * * * *